(12) United States Patent
Bostelmann et al.

(10) Patent No.: US 6,344,390 B1
(45) Date of Patent: Feb. 5, 2002

(54) METHODS OF FORMING THE BURIED STRAP AND ITS QUANTUM BARRIER IN DEEP TRENCH CELL CAPACITORS

(75) Inventors: Mathias Bostelmann, Savigay-le-Temple; Corine Bucher, Corbeil-Essonnes; Patrick Raffin, Joinville-le-Pont; Francis Rodier, Mondeville; Jean-Marc Rousseau, Auzeville-Tolosane, all of (FR)

(73) Assignee: International Business Machines Corporation, Armonk, NY (US)

( * ) Notice: Subject to any disclaimer, the term of this patent is extended or adjusted under 35 U.S.C. 154(b) by 22 days.

(21) Appl. No.: 09/607,217

(22) Filed: Jun. 30, 2000

(30) Foreign Application Priority Data

Jul. 1, 1999 (FR) .......................................... 99480047

(51) Int. Cl.[7] .......................................... H01L 21/8242
(52) U.S. Cl. ........................ 438/249; 438/243; 438/386; 438/392; 438/558
(58) Field of Search ............................... 438/249, 243, 438/246, 386, 389, 247, 392, 482, 558

(56) References Cited

U.S. PATENT DOCUMENTS 5,451,809 A * 9/1995 Shiozawa et al. ............ 257/516
6,008,104 A * 12/1999 Schrems ...................... 438/391
6,040,213 A * 3/2000 Canale et al. ................ 438/246
6,066,527 A * 5/2000 Kudelka et al. ............. 438/286
6,140,175 A * 10/2000 Kleinhenz et al. .......... 438/386

FOREIGN PATENT DOCUMENTS

JP          11-261026 A   *  9/1999

* cited by examiner

Primary Examiner—Michael Trinh
(74) Attorney, Agent, or Firm—Robert A. Walsh

(57) ABSTRACT

There is disclosed a method of forming a buried strap (BS) and its quantum conducting barrier (QCB) in a structure wherein a doped polycrystalline silicon region is exposed at the bottom of a recess and separated from a monocrystalline region of a silicon substrate by a region of an insulating material. First, a thin continuous layer of undoped amorphous silicon is deposited by LPCVD to coat said regions. The surface of this layer is nitridized to produce a $Si_3N_4$ QCB film. Now, at least one dual layer comprised of an undoped amorphous silicon layer and a dopant monolayer is deposited onto the structure by LPCVD. The recess is filled with undoped amorphous silicon to terminate the buried strap and its QCB. Finally, the structure is heated to activate the dopants in the buried strap to allow an electrical continuity between said polycrystalline and monocrystalline regions through the QCB by a quantum mechanical effect. All these steps are performed in situ in the same LPCVD tool.

54 Claims, 14 Drawing Sheets

US 6,344,390 B1

METHODS OF FORMING THE BURIED STRAP AND ITS QUANTUM BARRIER IN DEEP TRENCH CELL CAPACITORS

FIELD OF THE INVENTION

The present invention relates to the manufacture of semiconductor integrated circuits (ICs) and more particularly to improved methods of forming the buried strap and its quantum conducting barrier (QCB) in deep trench cell capacitors that are fabricated in-situ in the same manufacturing cycle. In addition, these methods allow the formation of new quantum conducting barrier structures by the use of materials such as silicon nitride ($Si_3N_4$), silicon oxynitride and the like instead of silicon dioxide ($SiO_2$).

BACKGROUND OF THE INVENTION

Buried straps (BS) in deep trenches are extensively used in the manufacture of DRAM chips, in particular for devices with groundrules equal or inferior to 0.25 µm. As known for those skilled in the art, in DRAM chips, an array transfer transistor, typically an insulated gate field effect transistor (IGFET) and a storage capacitor are associated to form an elementary memory cell. Basically, a deep trench having a buried plate surrounding its bottom portion is formed in a doped monocrystalline silicon substrate, then a thin dielectric film is conformally deposited thereon to coat the entire interior trench surface and finally the trench is filled with a doped polysilicon by LPCVD as standard. This doped monocrystalline silicon/dielectric film/doped polysilicon fill structure forms the memory cell capacitor. From the silicon surface, a recess is etched down to set the bottom edge of the buried strap. Undoped polysilicon is then deposited into this recessed area to form the buried strap (BS). The buried strap is bordered by the so-called active area (AA) of the monocrystalline substrate and is buried under the shallow trench isolation (STI) region. The surrounding surfaces of the buried strap have an important effect on its conductivity and solid phase transformation during subsequent oxidation and anneal steps (mainly active area oxidation). During these thermal steps, it occurs a recrystallization of the polysilicon of the region of the buried strap which is contiguous to the active area. This local epitaxy induces the propagation of dislocations along the so-called slip lines into the active area and in the substrate which affect cell capacitor performance. Specifically these defects are believed to cause unpredictable changes of the retention time for the capacitor. More precisely, single cell fails (SCF) occurred in some of the tested memory cells, despite the fact that the same bits were not found defective in previous tests. These defects are called Variable Retention Time (VRT) fails. The VRT problem was first identified for 0.25 µm DRAM chips where some memory cells in the array intermittently switched from a high retention state to a low retention state. Physical failure analysis (PFA) showed out that the most of analyzed VRT failed memory cells were impacted by these crystal dislocations in the active area and in the substrate that had been formed during said thermal steps in the course of the wafer processing.

To avoid or better control these VRT fails in memory cells, the use of a quantum conducting barrier layer between said contiguous silicon regions becomes an absolute requirement to maximize DRAM chip device performance. As a result, the buried strap will perfectly connect the IGFET and the capacitor of the memory cell only if after said thermal steps (oxidation and anneal), the dopants implanted in the buried strap diffuse into the active area through the quantum conducting barrier. The diffusion depth into the active area is a critical parameter. If the diffusion is too deep, a parasitic vertical transistor (VT) is formed, otherwise some junction leakages occur. Another critical parameter is the buried strap resistance itself which drives the memory cell access time. Consequently, the choice of the quantum conducting barrier material, the buried strap dopant type and concentration are very important factors for the overall chip reliability.

Starting with the FIG. 1 structure, a conventional buried strap and its quantum conducting barrier (QCB) formation process will be described in conjunction with FIGS. 2A–2F.

FIG. 1 schematically illustrates the starting structure 10 consisting of a p-type silicon substrate 11 with a conventional pad stack formed by a 5 nm thick $SiO_2$ layer 12 and a 220 nm thick $Si_3N_4$ pad layer 13. As apparent in FIG. 1, a deep trench referenced 14 has been formed in the substrate 11 by RIE etching as standard. Typically, deep trench 14 has a depth about 7 µm and an oblong section of about 450×220 nm at the substrate surface. Afterwards, the capacitor dielectric layer 15 is formed and the deep trench is filled with doped polysilicon material 16. After anneal the doped polysilicon fill 16 is recessed to a depth of 1.2 µm to allow the formation of a thermal $SiO_2$ layer 17 and a TEOS $SiO_2$ (pyrolitic) layer 18 forming the so-called collar layer 17/18 which provides a vertical isolation of the cell capacitor. The TEOS layer 18 is etched down to the remaining $Si_3N_4$ pad layer 13. Then, a second doped polysilicon layer 19 is deposited, annealed and polished down to the remaining $Si_3N_4$ pad layer 13. Polysilicon layer 19 is then recessed 130 nm under the substrate 11 surface. This sets the bottom edge of the buried strap. The collar layer 17/18 is removed from the upper part of the deep trench 14 exposed by a BHF HUANG A/B solution in a DNS 820 tool (Dai Nippon Screen, Yasu, Japan). This isotropic wet etch will recess the oxide materials of collar layer 17/18 slightly under the polysilicon layer 19 level as apparent in FIG. 1. At last, an angled phosphorous implant is performed in the trench sidewall that is exposed to create region 20 which is part of the active area. This step is followed by a 200:1 DHF pre clean in a CFM tool (sold by CFM, Westchester, Pa., USA) to remove 3 nm of the native $SiO_2$ layer. The next steps, i.e. the buried strap and its QCB formation must be performed very quickly e.g. within 1 hour (Q-time) of said pre clean step otherwise a rework would be necessary. In fact, this short processing time is required to avoid native oxidation of the exposed silicon substrate 11.

Now, turning to FIG. 2A, a 1.5 nm thin oxide QCB layer 21 is formed by thermal oxidation at exposed silicon surfaces in a LPCVD vertical thermal reactor (VTR) during boat insertion under ambient atmosphere. The QCB layer 21 is made of thermal $SiO_2$, a material which is an electrical insulator by nature, however, when deposited in very thin film it becomes electrically conductive by a quantum mechanical effect. An adequate reactor is the baseline undoped polysilicon VTR 7000+ manufactured by SVG THERMCO, Orange, Calif., USA.

The current working conditions are:

$N_2$ load lock: no

Q-time: 1 hour

Boat pitch: 0.14 inch

Batch size: 100 wafers centered

Insert temp.: 620° C.

Insert time: 10 min

It is important to notice that an uncontrollable oxidation rate is the main drawback of this step.

Now referring to FIG. 2B, a 300 nm thick undoped polysilicon layer 22 is deposited in the same LPCVD VTR tool. As mentioned above, this undoped polysilicon layer 22 is amorphous and will subsequently form the buried strap.

The working conditions are:

Deposition temp.: 550° C.

Deposition press.: 0.2 Torr

Deposition time: 167 min $SiH_4$ flow: 260 sccm

Deposition rate: 18 Å min

The $SiO_2$ QCB layer 21 will reduce recrystallization (epitaxial regrowth) of the amorphous silicon forming the buried strap and the number of dislocations nucleating at the region 20/polysilicon layer 22 interface. The QCB layer 21 thickness is critical because it has to be thick enough to prevent VRTs and parasitic vertical transistors (VTs) but thin enough to be conductive to insure low buried strap resistance. Consequently, the extreme positions in the LPCVD boat are forbidden, the goal is to have the oxygen level (dose) in layer 21 ranging from $2.2 \times 10^{15}$ atoms/$cm^2$ (corresponding to a too thin oxide layer) to $3.0 \times 10^{15}$ atoms/$cm^2$ (corresponding to a too thick oxide layer). In these conditions the batch size in the LPCVD VTR tool mentioned above is limited to 100 wafers centered in the boat.

A planarization of the polysilicon layer 22 is performed by chemical-mechanical polishing (CMP) down to the remaining $Si_3N_4$ pad layer 13. An adequate tool is the WESTECH 372M polisher manufactured by SPEEDFAM-IPEC, Phoenix, Ariz., USA, At this stage of the fabrication process, the structure is shown in FIG. 2C.

Now turning to FIG. 2D, the undoped polysilicon material of layer 22 is etched until a recess of 40 nm below the substrate 11 surface is obtained. This step which can be performed in an AME 5000 RIE etcher, a tool manufactured by APPLIED MATERIALS, Santa Clara, Calif., USA, is very critical. There will be no buried strap formation if the recess is too deep. On the other hand, there will be no isolation between the buried strap and the gate conductor line (the passing word line) if the recess is too shallow.

A vertical implantation of phosphorous (or arsenic) atoms is performed in the undoped amorphous polysilicon layer 22. To that end, a PI 9500 tool, manufactured by APPLIED MATERIALS, Santa Clara, Calif., USA is adequate. This implantation step affects the buried strap resistance and grain boundaries which in turn could cause recrystallization of the buried strap.

Typical working conditions are:

Phosphorus dose: $5 \times 10^{13}$ atoms/$cm^2$

Energy: 10 KeV

Angle: 0°

The resulting structure is shown in FIG. 2E where the implanted region bears numeral 23.

Now referring to FIG. 2F, the active area is defined by a photolithography step. Surrounding the active area, the shallow isolation trench (STI) region is formed and filled with $SiO_2$ and TEOS $SiO_2$ materials to form layers 24 and 25. An anneal is performed to densify the TEOS material. These different thermal steps cause the dopants in region 23 to diffuse into region 20 which is part of the active area through the QCB layer 21 forming the "electrical" buried strap referenced 26 in FIG. 2F. The electrical buried strap 26 thus results of the merging of regions 20, 21 and 23. Electrical buried strap 26 spreads beyond the phosphorus doped region 20 formed with the previous angled implant as illustrated by the continuous line (vs the dotted line) in FIG. 2F. The QCB layer 21 is getting thinner (and sometimes may even disappear) with migration of dopants from region 23 and solid phase transformation of this region 23 into polycrystalline form.

In summary, the conventional buried strap and its QCB formation process described above in conjunction with FIGS. 2A–2F includes the six following basic steps.

1. Forming the thermal $SiO_2$ quantum conducting barrier layer 21.
2. Depositing the undoped polysilicon layer 22.
3. Polishing the polysilicon layer 22 down to the silicon substrate surface.
4. Recessing the polysilicon layer 22 to 40 nm below the silicon substrate surface.
5. Performing the vertical ion implantation of phosphorous dopants in polysilicon layer 22 to create region 23.
6. Diffusing dopants of region 23 through the quantum conducting barrier layer 21 into region 20 during thermal oxide layer 24 and STI region 25 formation to create the electrical buried strap 26.

FIG. 3 is an enlarged view of structure 10 in the part which is encircled in FIG. 2F when the electrical buried strap 26 is defective. In this case, there is no electrical continuity between regions 20 and 23, the QCB layer 21 being either absent or destroyed. During the thermal steps of oxidation (to form the $SiO_2$ layer 24) and anneal (to densify the TEOS material of the STI region 25), there is produced a local epitaxy phenomena which partially transforms the polysilicon of region 23 in monocristalline silicon as illustrated by region 23A in FIG. 3. This recrystallization creates slip lines 27 that propagate through the region 20 into the substrate bulk. Sometimes, the formation of a large polysilicon grain can occur next to the monocrystalline (single) region 20 at region 23A location which is highly resistive. Accordingly, in both cases, region 23A makes the buried strap defective.

The above described conventional buried strap and its QCB layer fabrication process solved serious reliability problems for 0.25 µm DRAM chips but still raises a severe concern for the next generations (0.2 µm and less groundrules). For these reduced scale devices, oxidizing the region 23/active area interface during the boat insertion into the LPCVD tool to form QCB layer 21 still generates a high VRT level and a high buried strap resistance because of the defects mentioned above by reference to FIG. 3. These defects occur because the thickness of the grown $SiO_2$ of layer 21 is not well controlled and is not tunable in the manufacturing environment. A high buried strap resistance cause single cell fails (SCFs) which provide low temperature reliability fails (if the buried strap resistance is above 12 kOhms) which are added to VRT reliability fails. As the total reliability yield is the multiplication of them, it will become dramatic for these future generations of products. Moreover, before reliability test, pre fuse test showed out other fails due to low retention time and junction leakage along the deep trench and underneath the STI region 25 (referred to herein below as the sub-STI leakage). These failure mechanisms are shown in FIG. 4.

Now turning to FIG. 4, considering the profile A, the extremity of the buried strap 26 does not overlap the drain region 28 of IGFET 29, then a junction leakage occurs at top of the deep trench 14 and provides cell capacitor low retention time. This results of a limited diffusion of the buried strap 26 dopants which is supposed to be related to a QCB layer 21 too thick and/or not permeable enough to dopants. On the contrary, in the case of profile C, the buried strap dopant diffusion is too important, so that leakages along the deep trench 14 and under the STI region 25 occur. The leakage along deep trench 14 is due to a first parasitic NPN transistor created between the buried strap 26 and the buried plate bearing numeral 30 in FIG. 4. This defect is strongly dependent of the buried plate depth (nominal value 1.5 $\mu$m). On the other hand, the sub-STI region leakage is due to another parasitic NPN transistor created between two adjacent deep trenches because diffusion regions 20 of the two nearest deep trenches (DT's) are connected under the STI region 25. This defect is very sensitive to the shallow isolation trench depth (nominal value 0.26 $\mu$m). Profile C is related to a QCB layer 21 which is too thin and/or discontinued at the collar layer 17/18 top corner (labeled D in FIG. 4). Profile B shown in FIG. 4 is the right one which overcomes all the problems discussed above.

SUMMARY OF THE INVENTION

It is therefore a primary object of the present invention to provide improved methods of forming the buried strap and its quantum conducting barrier in deep trench cell capacitors wherein all the high temperature deposition steps are performed in-situ in the same CVD tool.

It is therefore a primary object of the present invention to provide improved methods of forming the buried strap and its quantum conducting barrier in deep trench cell capacitors that allows high productivity by increasing the number of wafers processed at each run.

It is therefore a primary object of the present invention to provide improved methods of forming the buried strap and its quantum conducting barrier in deep trench cell capacitors that allows manufacturing cost reduction by reducing the number of processing steps.

It is another object of the present invention to provide improved methods of forming the buried strap and its quantum conducting barrier in deep trench cell capacitors that reduces the chemical contamination from the atmosphere and undesired thermal oxidation effects as a result of a totally clusterized process.

It is another object of the present invention to provide improved methods of forming the buried strap and its quantum conducting barrier in deep trench cell capacitors that allows to place the dopants wherever desired in the buried strap with the adequate concentration.

It is another object of the present invention to provide improved methods of forming the buried strap and its quantum conducting barrier in deep trench cell capacitors which allows an accurate and total control of both the physical and electrical parameters thereof.

It is still another object of the present invention to provide multilayered quantum conducting barrier structures fabricated by these methods or other as well.

According to the present invention there are described methods of forming the buried strap and its quantum conducting barrier (QCB) in deep trench cell capacitors, wherein the QCB can be either of the single or multiple type. According to a first embodiment of the present invention there is described a method of forming a strap (BS) and its quantum conducting barrier (QCB) to make an electrical connection between two semiconductor regions having a different crystalline nature separated by a region of an insulating material comprising the steps of:

forming a thin continuous layer of undoped amorphous silicon to coat said regions;

forming a QCB layer onto the structure;

forming at least one dual layer comprised of an undoped amorphous silicon layer and a dopant monolayer onto the QCB layer to terminate the strap and its QCB; and, heating the structure to activate the dopants in the strap to allow an electrical continuity between said semiconductor regions through the QCB by a quantum mechanical effect, wherein all these steps are performed in situ in the same CVD tool.

According to a second embodiment of the present invention there is described a method forming a strap (BS) and its quantum conducting barrier (QCB) to make an electrical connection between two semiconductor regions having a different crystalline nature separated by a region of an insulating material comprising the steps of:

forming a first QCB layer coating said polycrystalline and monocrystalline regions;

forming a thin continuous layer of undoped amorphous silicon to coat said regions;

forming a second QCB layer onto the structure;

forming at least one dual layer comprised of an undoped amorphous silicon layer and a dopant monolayer onto the QCB layer to terminate the strap and its QCB; and, heating the structure to activate the dopants in the strap to allow an electrical continuity between said semiconductor regions through the QCB by a quantum mechanical effect, wherein all these steps are performed in situ in the same CVD tool.

For instance, they can be conducted by LPCVD with a cageless process. The material forming the QCB is silicon oxynitride, silicon nitride and the like. Nitride based materials can be deposited in thin films, so that they are better controlled than oxide based materials. The ion implantation step which created crystalline defects induced by ions collision is now eliminated. Arsenic is preferred to phosphorus as a dopant because of its slower migration through the QCB layer avoiding thereby parasitic transistors formation. Finally, the LPCVD cageless process permits to place the dopants in desired locations of the buried strap with the adequate concentration.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF PREFERRED EMBODIMENT

Figure 1:
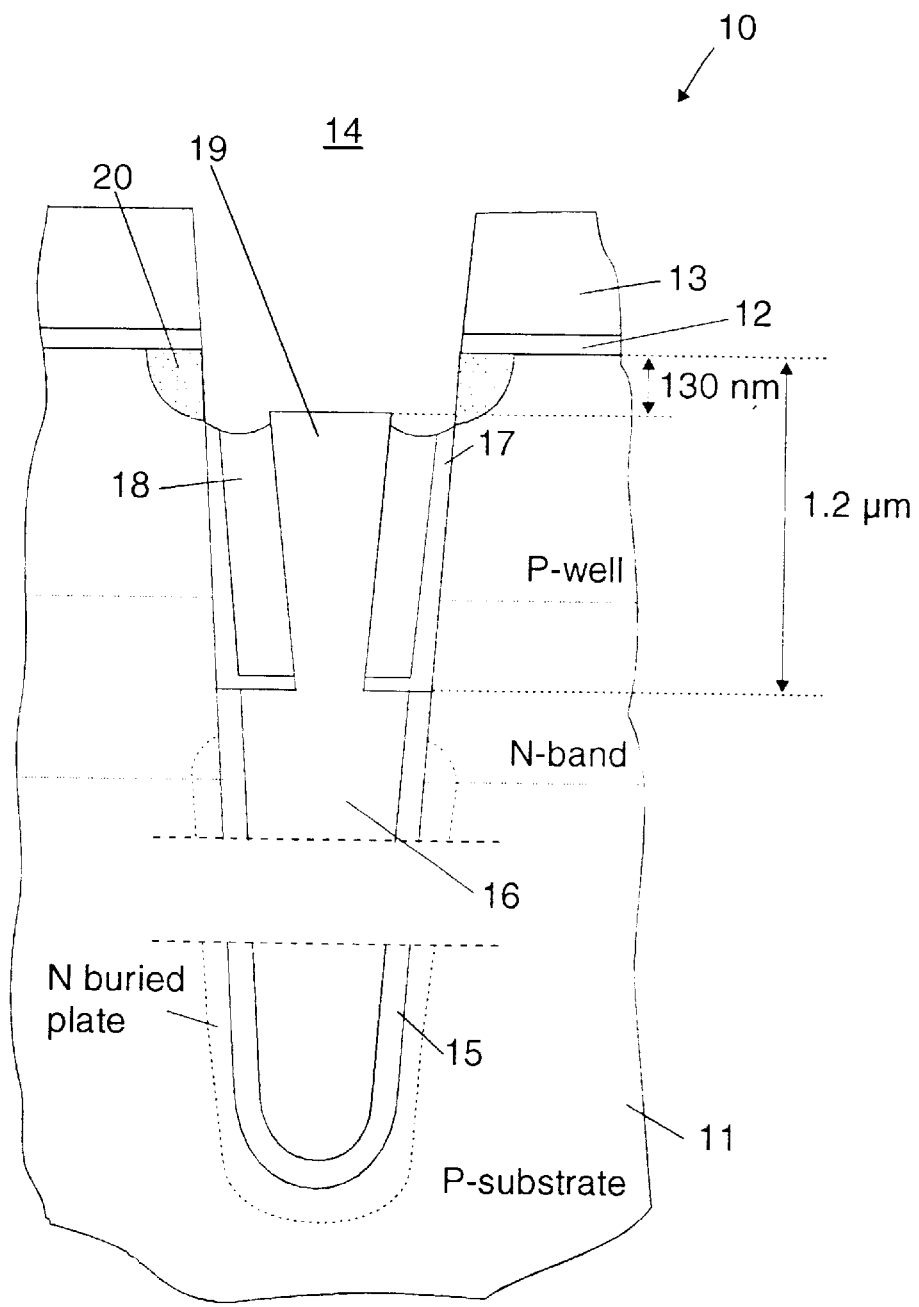
FIG. 1 shows the starting silicon structure at the initial stage of the buried strap fabrication process.
Figure 2A:
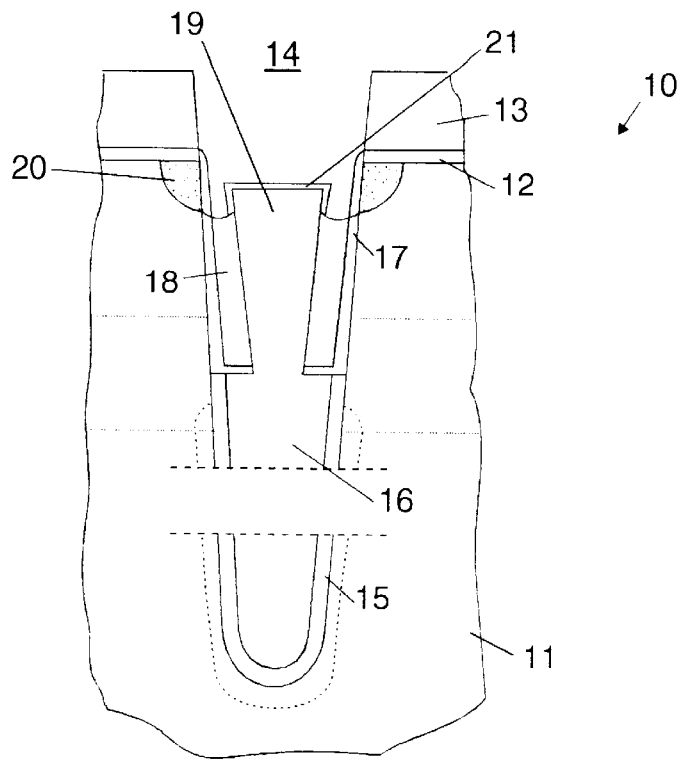
FIGS. 2A–2F show the structure of FIG. 1 undergoing the essential steps of a conventional buried strap fabrication process.
Figure 2B:
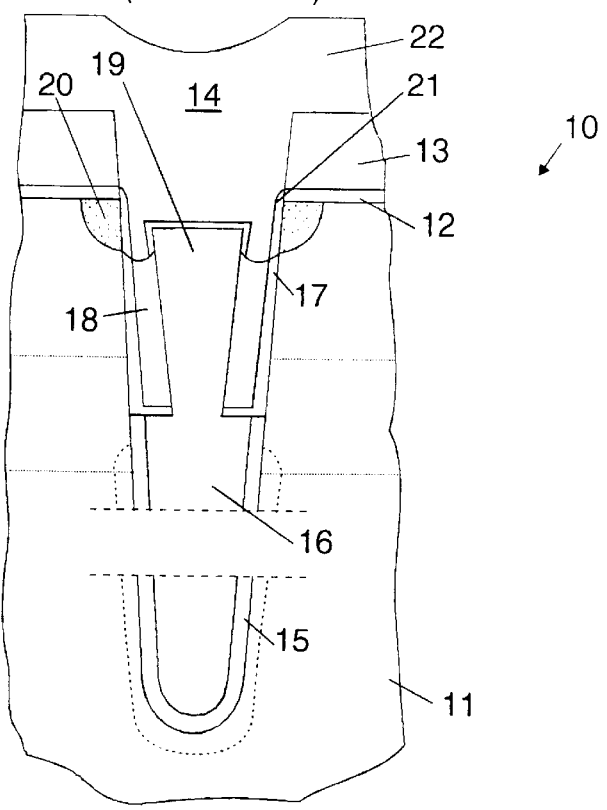
Figure 2C:
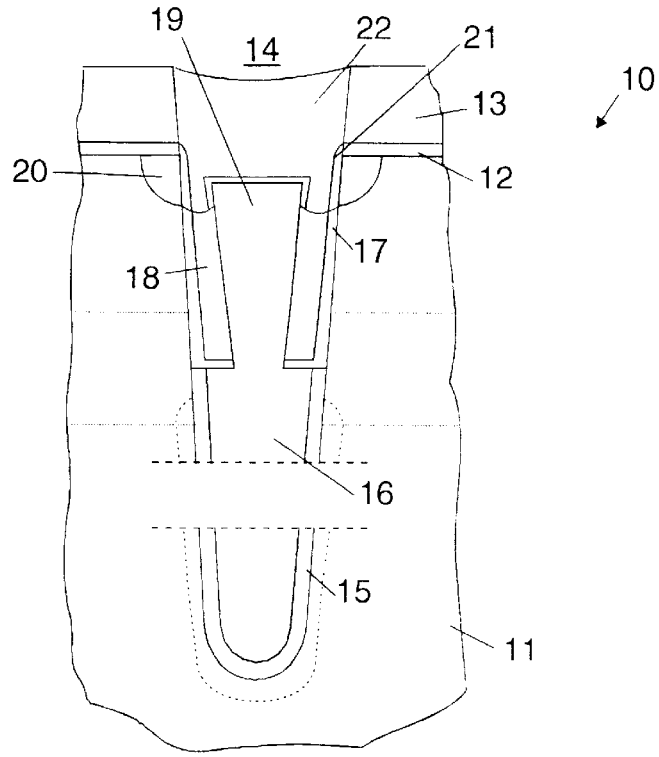
Figure 2D:
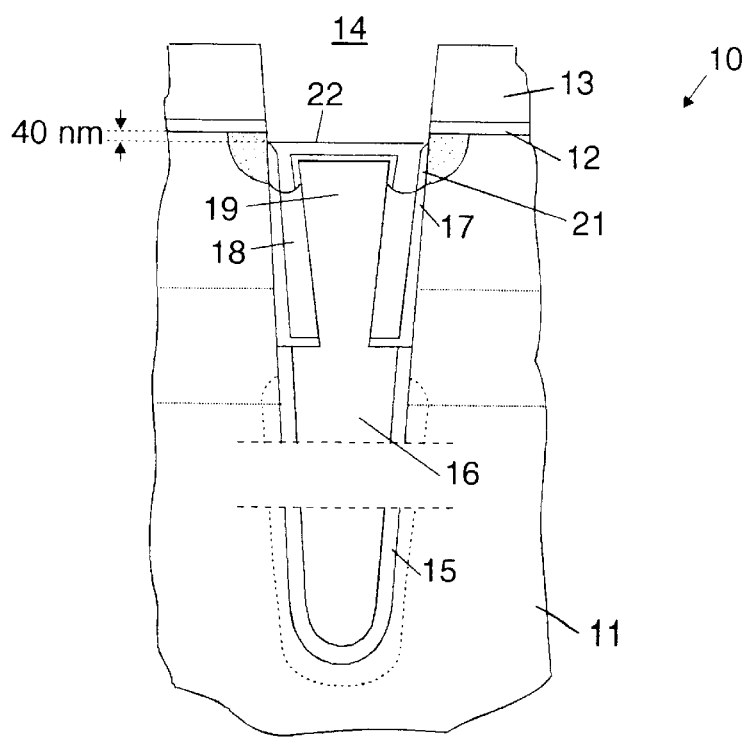
Figure 2E:
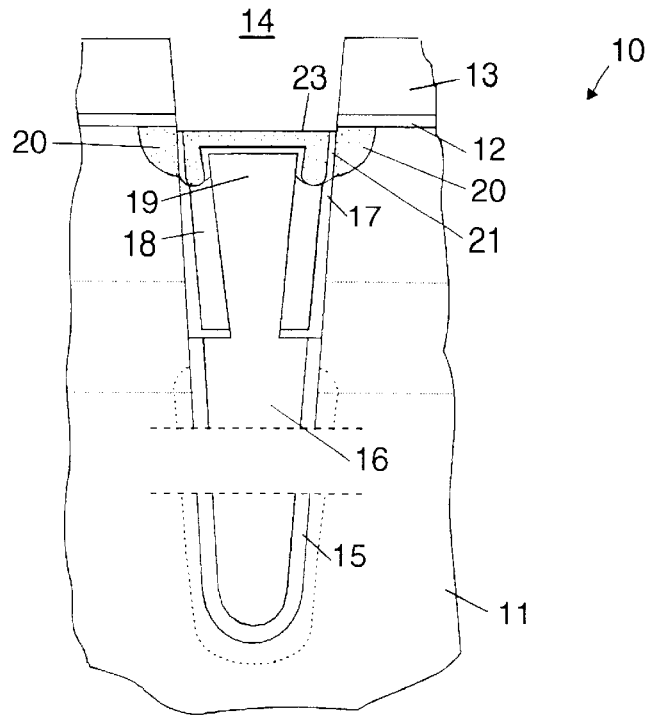
Figure 2F:
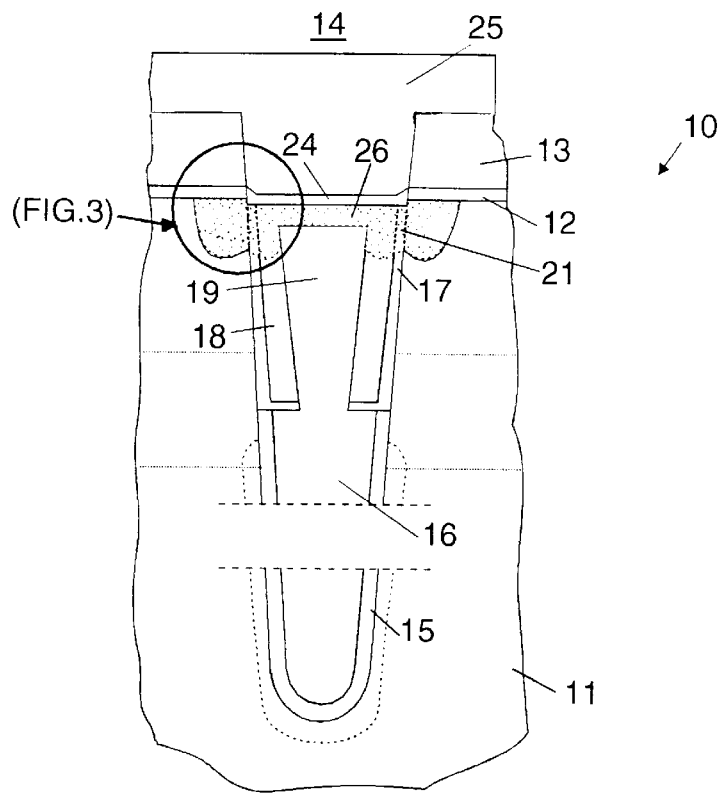
Figure 3:
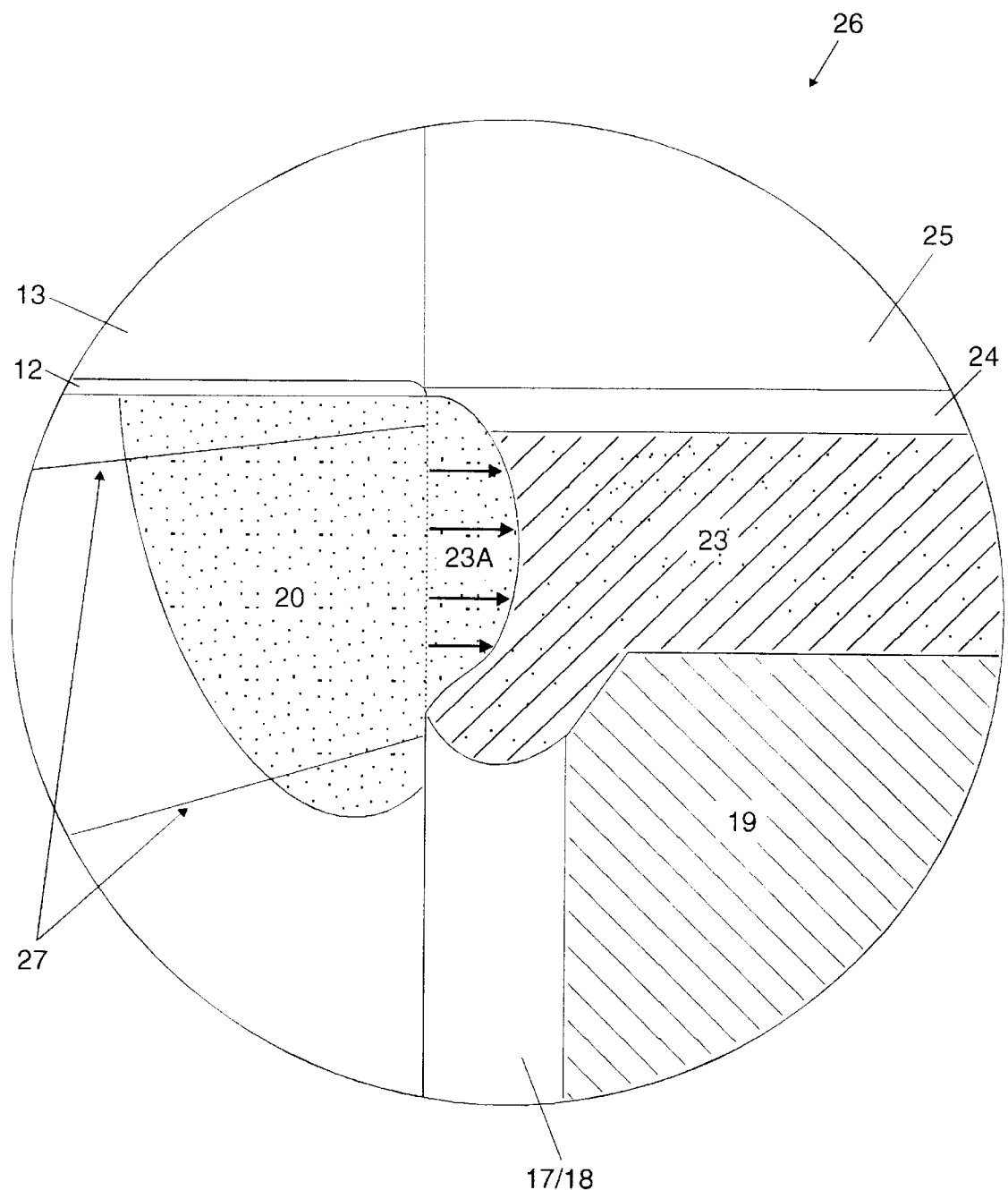
FIG. 3 is a cross section showing an enlarged view of a portion of the FIG. 2F structure after the buried strap has been fabricated and found defective.

To fix defects related to the buried strap (recrystallization and high resistance) and to the QCB layer (junction and sub-DT leakages), Applicant's inventors have completely modified the conventional buried strap (BS) fabrication process described above to allow to cluster processing steps 1,2 and 5. This has been made possible by a number of process changes.

1. A very thin continuous and homogeneous layer of undoped (intrinsic) amorphous silicon is deposited into the trench 14 (in reality, at this stage of the fabrication process, the trench is reduced to a recess still referenced 14 for sake of simplicity) to get rid of the discontinuity created by the collar layer 17/18 which separates monocrystalline silicon region 20 from the polysilicon fill 19.

2. Then, the quantum conducting barrier (QCB) layer is formed by superficially nitridizing this amorphous silicon layer. The nature of the QCB material is thus changed. Instead of the thermally grown SiO$_2$ material extensively used in the conventional BS fabrication process, the QCB material now is a nitride compound preferably formed by nitridization. Nitridization allows to form a thin film, the thickness of which is very well controlled unlike the SiO$_2$ QCB layer 21 thickness which was uncontrollable because it was grown as a native oxide during a thermal step. As a result, because the new QCB layer is thinner, the resistive path therethrough is decreased.

3. Next, the buried strap is formed in-situ by chemical vapor deposition (CVD). This step includes the deposition of at least one dual layer composed of an undoped amorphous silicon layer and a monolayer of arsenic atoms. The CVD deposition process eliminates the need of the ion implantation step which created crystalline defects induced by ions collision. On the other hand, to create such a monolayer, arsenic atoms are preferred to phosphorus atoms for doping the buried strap because they migrate slower through the quantum barrier layer. This avoids the formation of the two parasitic transistors mentioned above, and thus the sub-DT leakages. Moreover, this CVD process permits to locate the dopant in the buried strap to optimize the diffusion path in region 20.

The method of forming the buried strap according to the present invention will now be described in more details by reference to FIGS. 5A–5D, still starting with the FIG. 1 structure, now referenced 10' to take into account the changes that will be brought up by the invention.

Figure 5A:
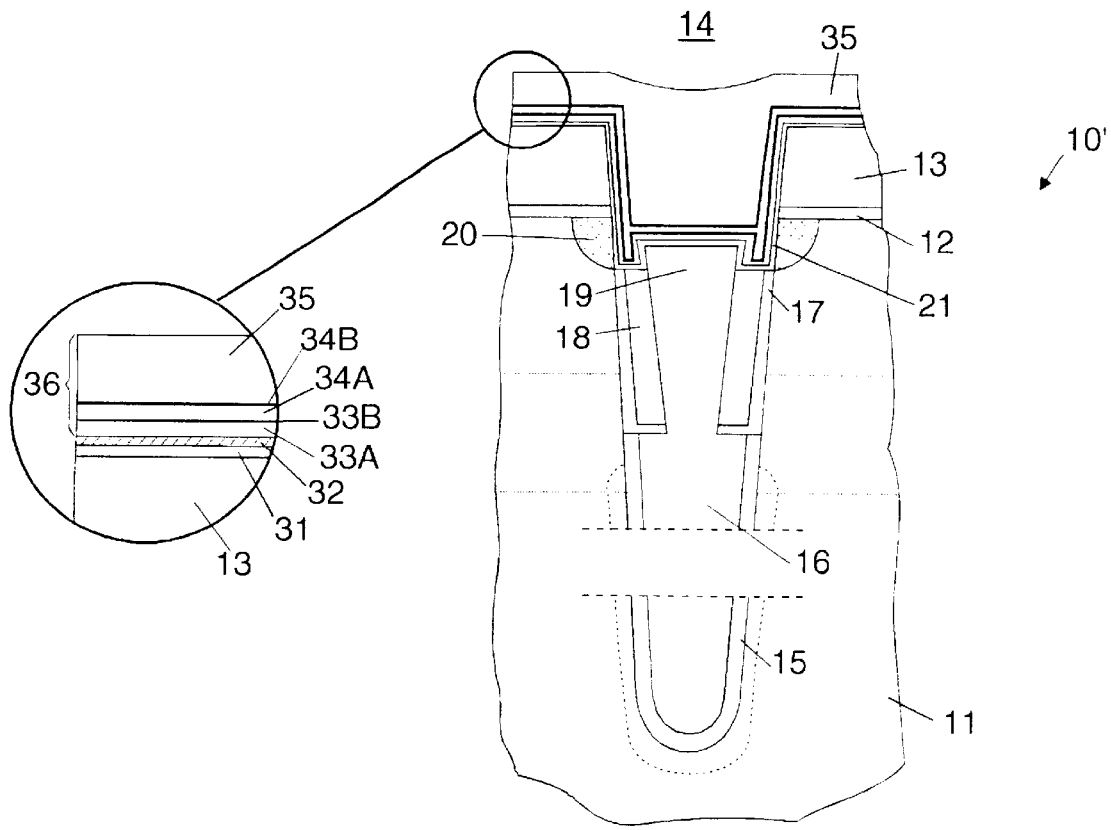
FIGS. 5A–5D show the structure of FIG. 2 undergoing the essential steps of the improved buried strap fabrication process according to the present invention.

Now referring to FIG. 5A, a 100 A thick undoped amorphous silicon layer 31 is conformally deposited onto structure 10' surface in a CVD reactor. This layer 31 forms a continuous and homogeneous film on all the contiguous regions and interfaces that are exposed in trench recess 14, ensuring thereby the continuity of the QCB layer that will be subsequently formed.

Now the QCB layer is formed by local nitridization of the silicon layer 31.

For instance, a Si$_3$N$_4$ quantum conducting barrier layer 32 is formed by NH$_3$ baking of the 100 A thick amorphous silicon of layer 31. The NH$_3$ baking reaction is conducted at a temperature between 550° C. and 700° C. until the desired Si$_3$N$_4$ QCB layer thickness is achieved, i.e. for a time which essentially depends on the equipment used. Typically, the thickness of nitride quantum barrier layer 32 is controlled to be in the 10–15 Å range. Note that the thickness (100 Å of amorphous silicon layer 31 is not thick enough for dislocation propagation. Preferred QCB materials are silicon oxynitride, silicon nitride and the like. These materials include stoichiometric multi-compounds which form more uniform and continuous films than single compounds on the plurality of contiguous regions 17/18, 19 and 20. Porosity and discontinuity are not permissible with regards to the desired QCB properties because they form nucleation sites for buried strap recrystallization and favor deep dopant diffusion which can create a parasitic bipolar transistor. The desired film continuity cannot be directly obtained on said continuous regions with the QCB layer 32 because it cannot be grown on the top of the collar layer 17/18 and it cannot be stoichiometric on region 20. However, if the QCB layer is grown on said contiguous regions, a second quantum barrier would become necessary to minimize these detrimental effects that are related to the collar layer 17/18.

Still in the same CVD reactor, the pyrolysis of SiH$_4$ (Si atoms source) forms the intrinsic amorphous silicon layer 33A and the pyrolysis of AsH$_3$ (As atoms source) forms the As monolayer 33B. It is important to remark that the arsenic atoms (which are preferred to phosphorus atoms) are deposited as a monolayer. The deposition of this dual intrinsic amorphous silicon/arsenic monolayer structure, generically referenced 33, can be repeated (33, 34, . . . ) as shown in FIG. 5A) until the desired doping that is finally expected for the buried strap is attained. Once the operation of depositing at least one dual layer is terminated, the remaining volume in the trench recess 14 is filled in excess with intrinsic amorphous silicon according to the same deposition technique to form layer 35. For sake of commodity, the pile of layers 33A, 33B, 34A, 34B, . . . which will subsequently form the electrical buried strap will be referred to herein below as the stack 36. For that deposition step, typical deposition temperatures range from 500° C. to 650° C. and pressures between 0.2 Torr and 200 Torr. Therefore, according to a significant aspect of the present invention, undoped amorphous silicon layer 31, Si$_2$N$_4$ QCB layer 32 and stack 36 are formed in-situ in the same CVD reactor and during the same processing cycle (run). At this stage of the novel BS fabrication process, the structure is shown in FIG. 5A.

Figure 5B:
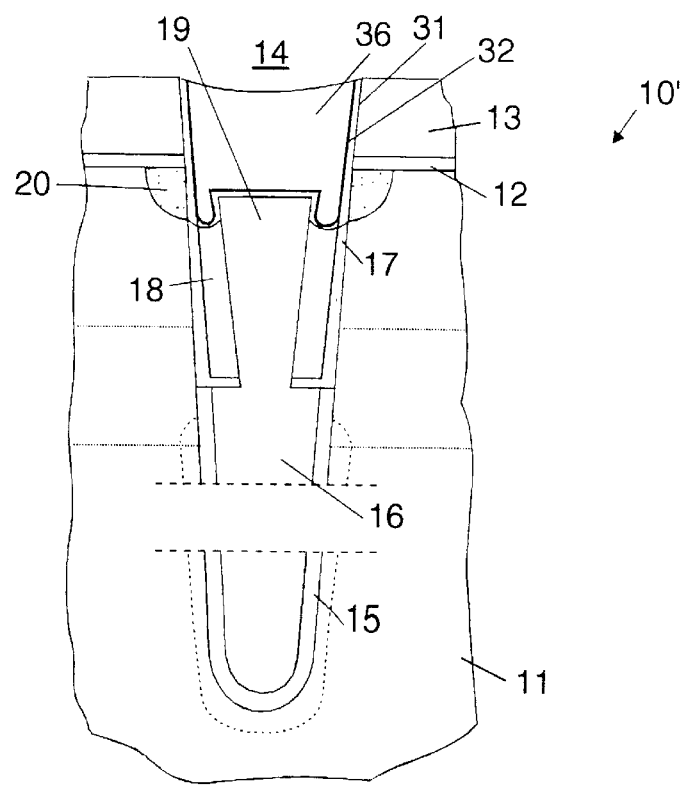

FIG. 5B shows resulting structure after CMP polish using Si$_3$N$_4$ layer 13 as an etch stop layer.

Figure 5C:
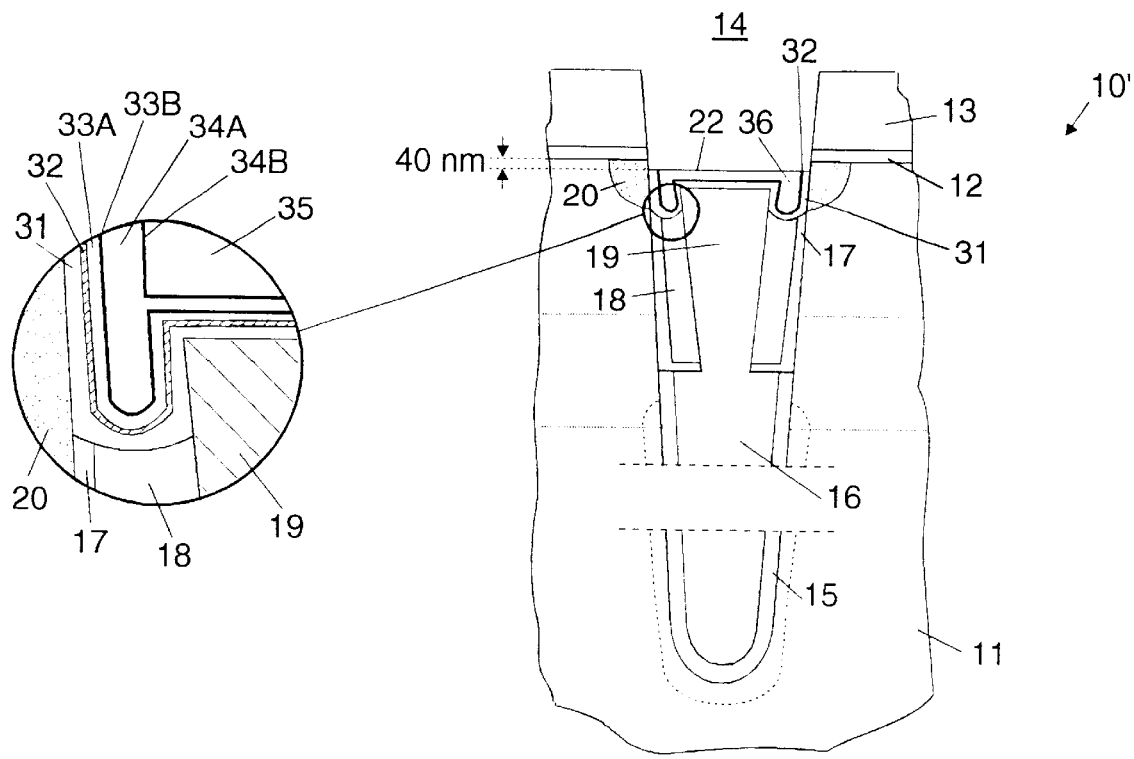

Referring to FIG. 5C, structure 10' is etched as described above in the prior art section, but in the present case all layers 31 to 35 forming the stack 36 are etched to recess the stack 40 nm below the silicon substrate 11 surface.

Figure 4:
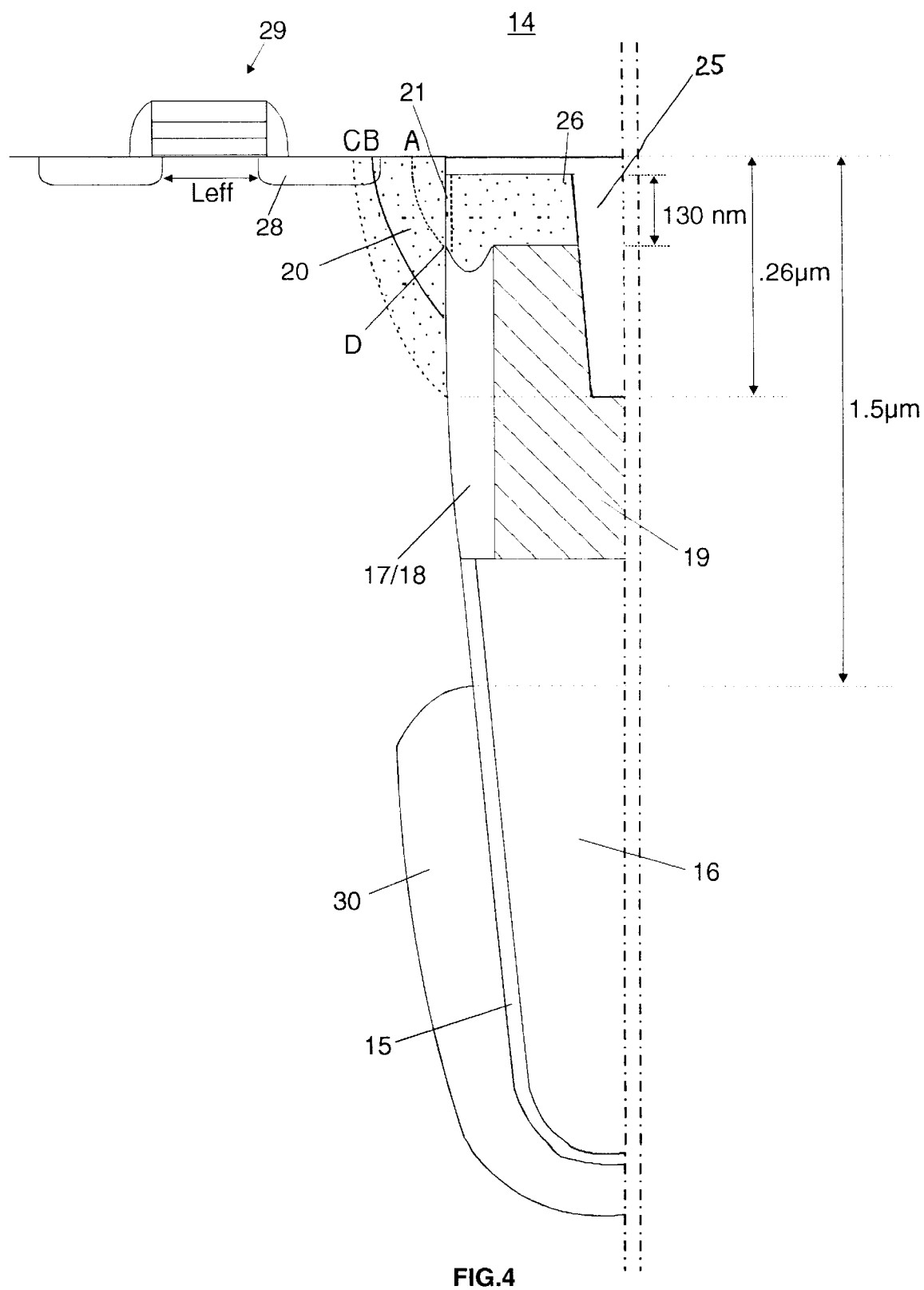
FIG. 4 shows the IGFET/storage capacitor combination to point out the drawbacks that result of the conventional buried strap fabrication process.
Figure 5D:
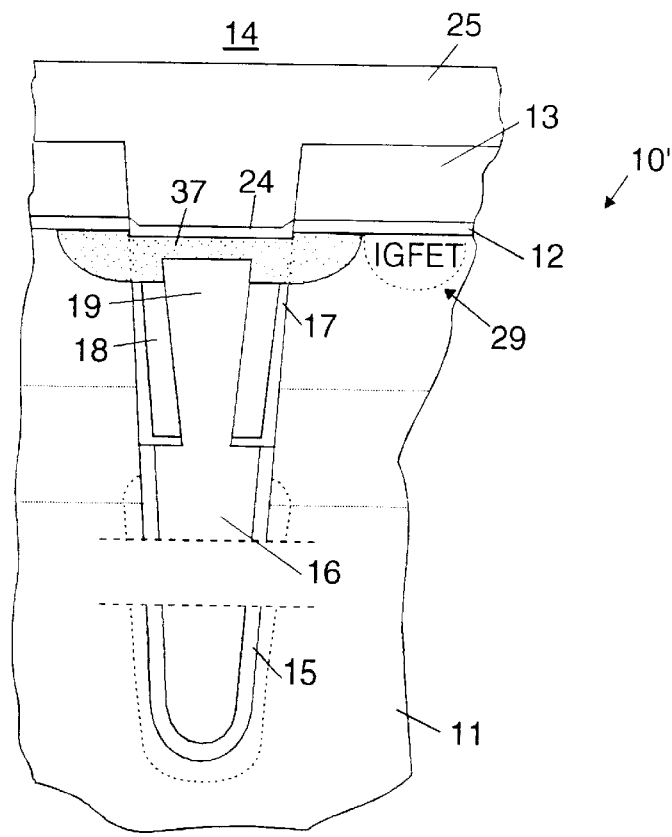

Referring to FIG. 5D, after a masking step, the STI region is etched, a TEOS layer is deposited and planarized as described above and annealed to densify the TEOS material. The remaining of stack 36 is now buried and the dopants contained therein activated. Diffusion region 20 is widened due to As atoms migration from monolayers 33B, . . . through Si$_3$N$_4$ QCB layer 32, it must intersect with the IGFET diffusion region 29 to prevent junction leakage and it must have a depth less than 260 nm (see FIG. 4), because otherwise, sub DT leakages are formed along the collar layer 17/18 and under the STI region 25.

At the end of these processing steps, the electrical buried strap 37 is formed as resulting of the combination of regions 20, 31, 32 and 36.

The new electrical buried strap and its quantum conducting barrier process formation now includes four steps (instead of six in the conventional fabrication process) that are listed below.

1. The $Si_3N_4$ quantum conducting barrier and the buried strap formation is performed in-situ in the same CVD reactor (FIG. 5A).
2. CMP polishing the intrinsic amorphous silicon layer 35 down the $Si_3N_4$ pad layer 13 (FIG. 5B).
3. Recessing the stack 36 to set its bottom 40 nm below the silicon substrate 11 surface (FIG. 5C).
4. After processing steps not described here, oxidizing and annealing the structure 10' to cause the arsenic atoms to diffuse through the $Si_2N_4$ QCB layer 32 into region 20 (see FIG. 5D) to ensure an electrical continuity between contiguous regions 19 and 20 to create the electrical buried strap 37.

This in-situ global process step 1 has been made possible by adapting the baseline undoped polysilicon LPCVD VTR 7000+ reactor mentioned above to receive NH3 and AsH3 supplement gas lines and a 10 Torr baratron gauge. As the barrier is created inside the reactor, the use of the $N_2$ load lock is now possible. Because no thermal native $SiO_2$ growth can occur during boat insertion under $N_2$ atmosphere, the extreme wafer positions in the boat are then allowed and the thickness of the nitridized QCB layer is now uniform wafer to wafer. Concerning the buried strap deposition, the number of dual layers (comprised of an amorphous undoped silicon layer and a monolayer of arsenic atoms) easily and accurately determines the buried strap doping level, and thus the chip performance. The arsenic monolayers permits to get a higher doping level than the one obtained by ion implantation and without generating crystalline defects, which are known to increase the buried strap internal resistance. Moreover, each arsenic monolayer acts as a barrier to buried strap recrystallization if there are located very close to region 20.

A major global benefit resulting from this in-situ process of fabricating the buried strap and its quantum conducting barrier is a huge improvement in terms of productivity. As a matter of fact, two process steps are suppressed and the batch size increases from 100 wafers to 150 wafers (as it will be shown in the practical example given below). Another advantage is to widen the manufacturing flexibility with the Q-time between BS pre clean and deposition steps increasing from 1 to 3 hours thanks to the $N_2$ load lock. Still another advantage is the reduction of chemical contamination from the atmosphere and the elimination of any undesired reoxidation of the silicon surfaces which directly result of a totally clusterized process. Still another further advantage of this in-situ process is to allow a complete and accurate control of both the physical and electrical parameters of the buried strap and its quantum conducting barrier.

In the preferred embodiment, wafer batch processing based on A LPCVD process will be only considered. Let us give some practical examples of operating conditions when for instance the THERMCO VTR 7000 reactor mentioned above is used to fabricate a buried strap with different types of QCB structures. In this case, the boat pitch is 0.14 inch and the batch size is 150 wafers (instead of 100 in the conventional buried strap fabrication process).

Figure 6A:
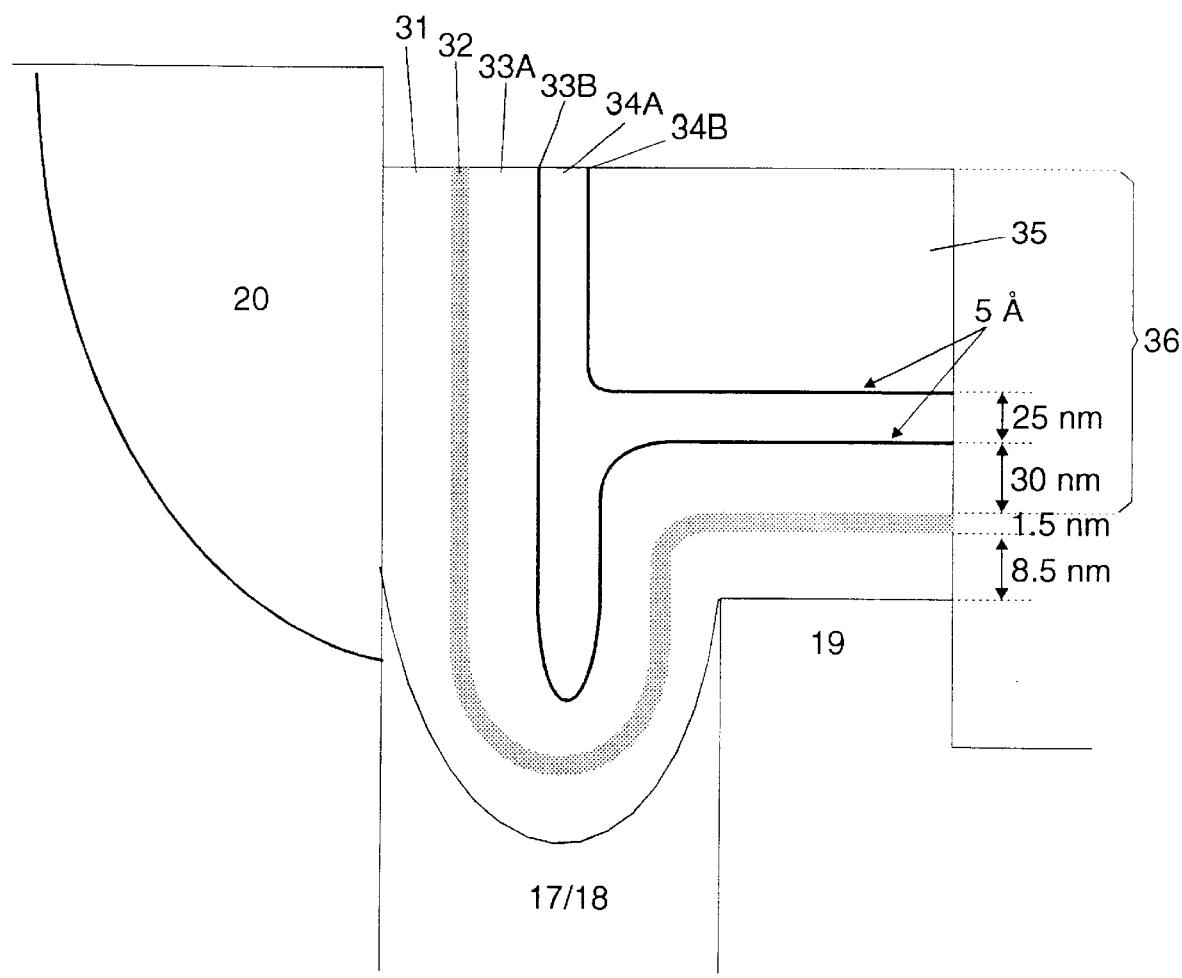
FIGS. 6A and 6B show the single Si—$Si_3N_4$ QCB structure fabricated according to a first preferred embodiment of the methods of the present invention based on a LPCVD process before and after anneal to produce the electrical buried strap respectively.
Figure 8:
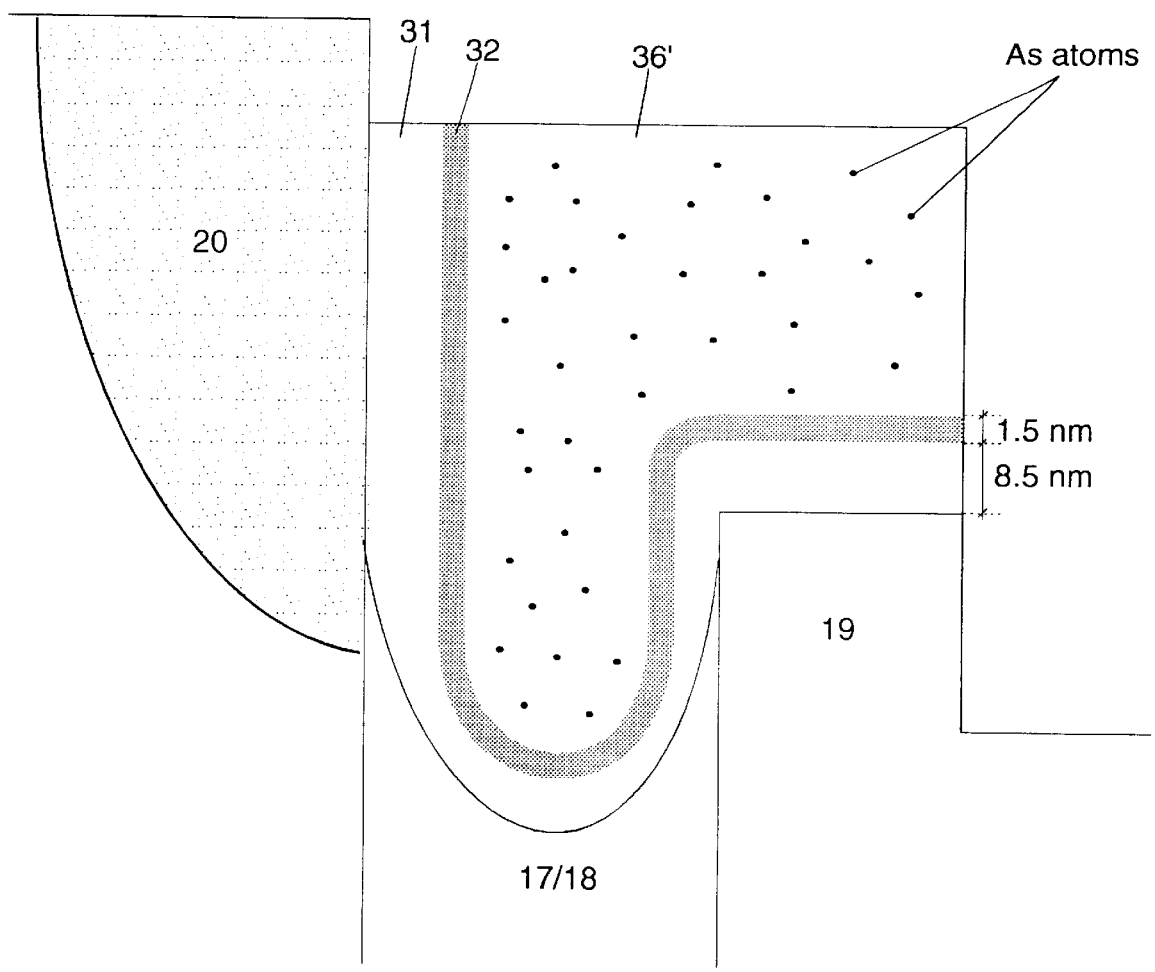
FIG. 8 shows the single Si—Si$_3$N$_4$ QCB structure fabricated according to another further preferred embodiment of the methods of the present invention based on a SACVD process.

Single $Si$—$Si_3N_4$ QCB structure formation
1. Formation of the undoped amorphous silicon (Si) layer 31
   Q-time: 3 hours
   Insert temp.: 550° C.
   Insert time: 10 min
   $SiH_4$ flow: 260 cc/min
   $SiH_4$ pyrolysis temp.: 550° C.
   $SiH_4$ pressure: 0.45 Torr
   $SiH_4$ cycle 1 time: 4 min
   $N_2$ load lock: Yes
2. Formation of the $Si_2N_4$ QCB layer 32
   Nitridization temp.: 550° C.
   Nitridization pressure: 6 Torrs $NH_3$ flow: 2000 cc/min
   Stabilization ($NH_3$): 2 min
   Nitridization time: 60 min
   Gas evacuation: 10 min
3. Formation of the buried strap stack 36
   $SiH_4$ pyrol. temp.: 550° C.
   $SiH_4$ Pressure: 0.45 Torr
   $AsH_3$ pyrol. temp.: 550° C.
   $AsH_3$ pressure: 0.5 Torr
   $SiH_4$ cycle 2 time: 13 min (formation of layer 33A)
   $AsH_3$ cycle 1 time: 10 min (" " 33B)
   $SiH_4$ cycle 3 time: 25 min (" " 34A)
   $AsH_3$ cycle 2 time: 10 min (" " 34B)
   $SiH_4$ cycle 4 time: 153 min (" " 35)
   $SiH_4$ flow: 260 cc/min
   $AsH_3$ flow (0.7% in $H_2$): 400 cc/min
   Aver. silicon dep. rate: 15 Œ/min The total arsenic dose is $0.8 \, 10^{15}$ atoms/$cm^2$. The resulting structure is shown in FIG. 6A. It is important to point out that the illustrations of FIGS. 6A and 8 are not necessarily drawn to scale.

As apparent in FIG. 6A, the QCB 32 is shifted by about 8.5 nm from region 20. The characteristic of this $Si_3N_4$ QCB layer after SIMS measurements is the nitrogen (N) level which is equal to $3.0 \times 10^{15}$ atoms/$cm^2$ with a dispersion of about $0.2 \, 10^{15}$ atoms/$cm^2$ for a batch of 150 wafers. This result strengthens the manufacturability of the in-situ global process.

4. Formation of the electrical buried strap 37

Figure 6B:
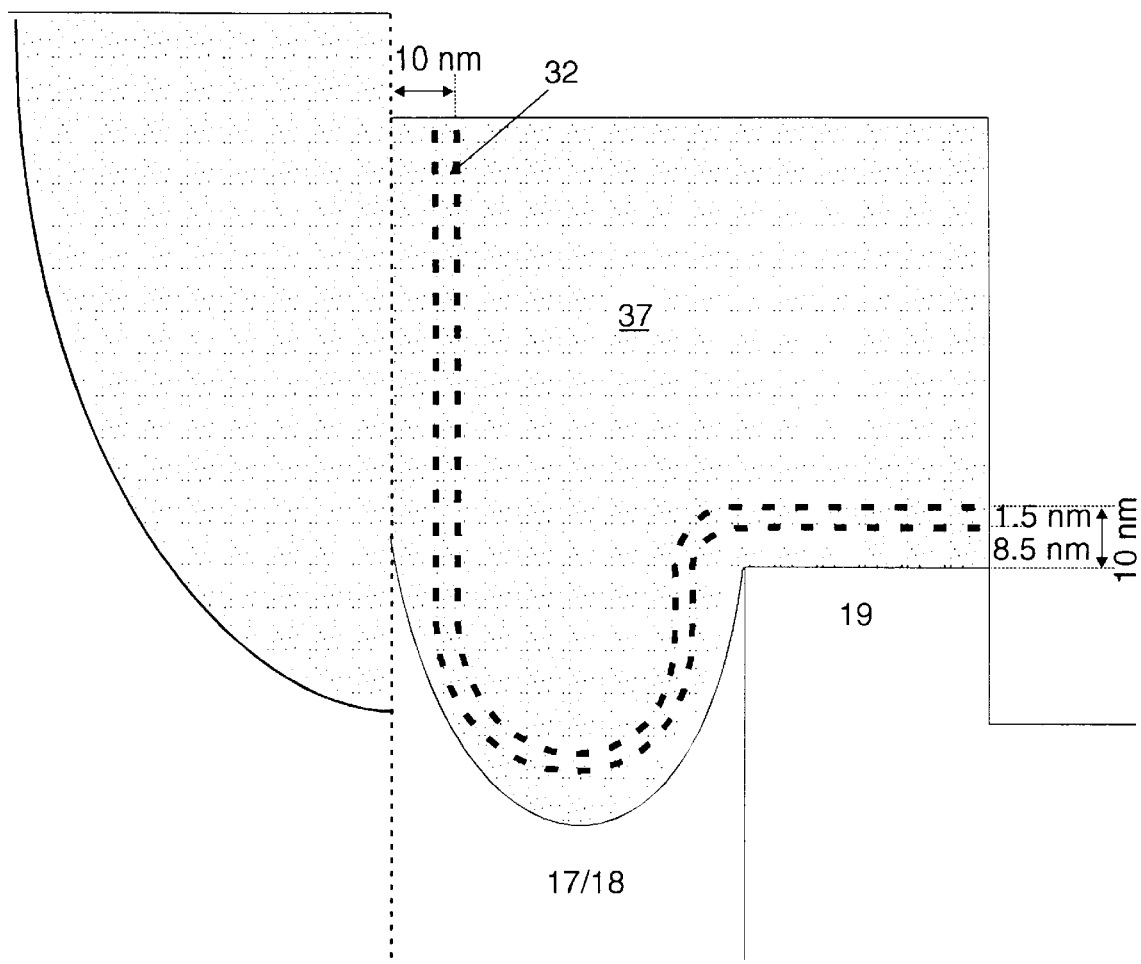

During formation of region 24 and the anneal to densify the TEOS material of region 25, the electrical buried strap 37 is formed as illustrated in FIG. 6B.

Double $SiON$—$Si$—$Si_3N_4$ QCB structure formation

Figure 7A:
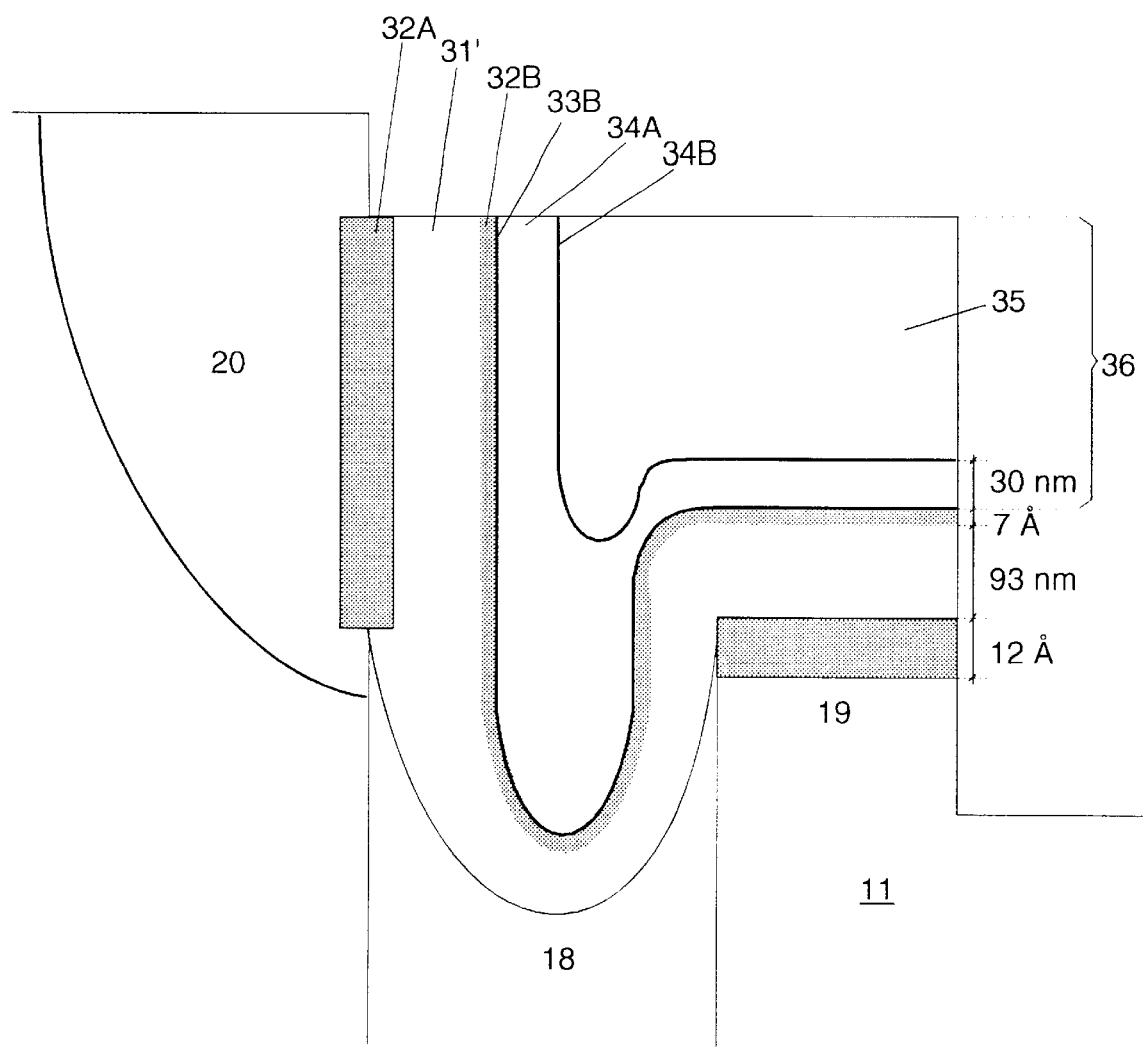
FIGS. 7A and 7B show the double SiON—Si—Si$_3$N$_4$ QCB structure fabricated according to another preferred embodiment of the methods of the present invention still based on a LPCVD process before and after anneal to produce the electrical buried strap respectively.
Figure 7B:
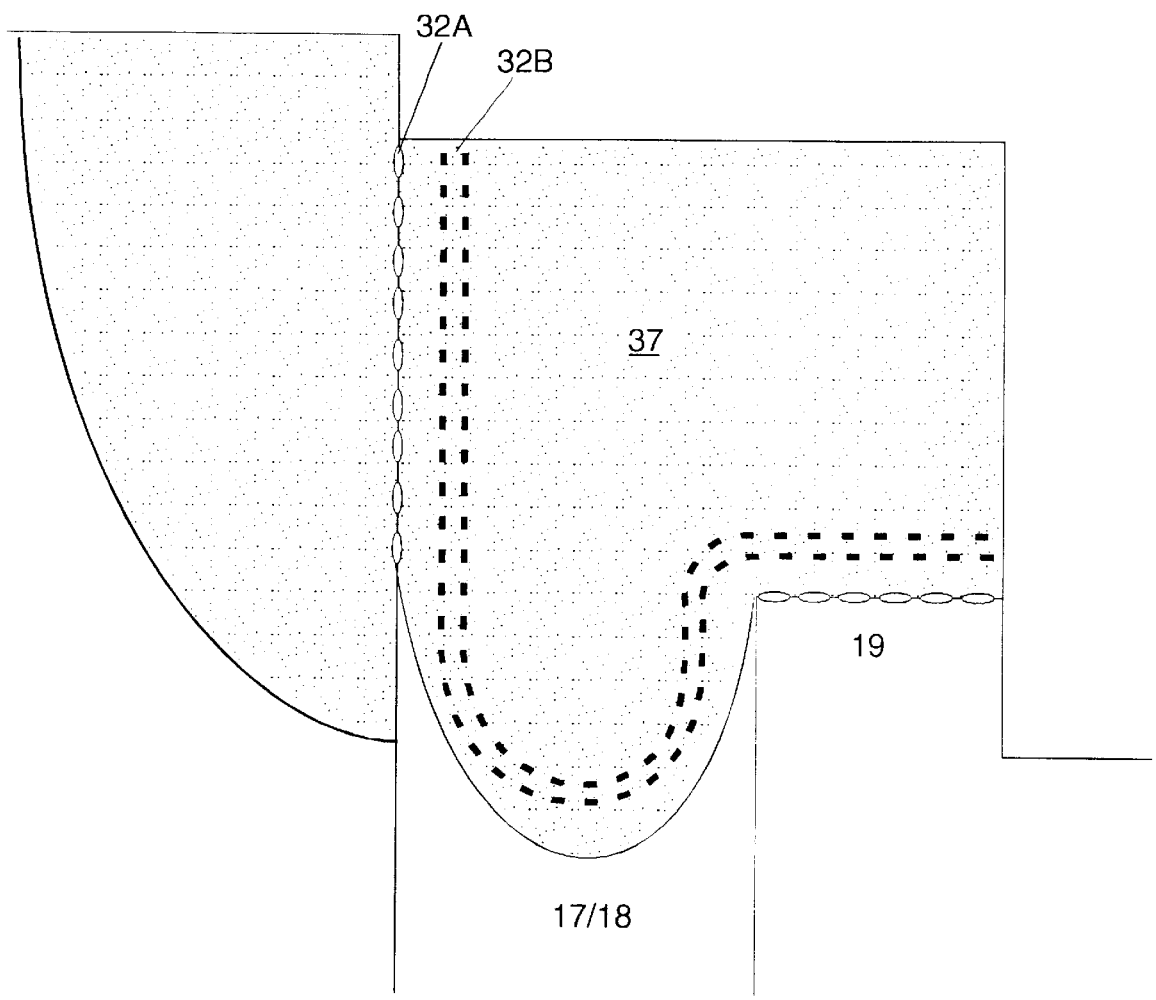

Another type of QCB structure will be now described in conjunction with FIGS. 7A and 7B, to demonstrate that they are different ways of making an adequate electrical buried strap. A double $SiON$—$Si$—$Si_3N_4$ QCB structure has given good results for current memory products. The first QCB is an oxynitride (SiON) layer due to the presence of native thermal $SiO_2$ on regions 19 and 20 and the second one is a pure $Si_3N_4$ layer because it is formed on a just deposited amorphous silicon layer. This involves very few modifications of the previous operating conditions as it will be made apparent from the following sequence.

1. Formation of the 1st oxynitride (SiON) QCB layer 32A
   Q-time: 3 hours
   Insert temp.: 550° C.
   Insert time: 10 min
   Ramp-up time: 20 min (to 650° C. under $NH_3$)

Nitridization temp.: 650° C.
Nitridization time: 30 min(formation of layer 32A) Rampdown time: 50 min (to 550° C. under $NH_3$)
2. Formation of the 100 Å undoped polysilicon (Si) layer 31'
   $SiH_4$ pyrolysis temp.: 550° C.
   $SiH_4$ Pressure: 0.45 Torr
   $SiH_4$ flow: 260 cc/min $SiH_4$ cycle 1 time: 4 min
3. Formation of the 2nd $Si_3N_4$ QCB barrier layer 32B
   $NH_3$ flow: 2000 cc/min
   Nitridization temp.: 550° C.
   Nitridization time: 30 min
   Pressure: 6 Torr
4. Formation of the buried strap stack 36
   $AsH_3$ pyrolysis temp.: 550° C.
   $AsH_3$ pressure: 0.5 Torr
   $SiH_4$ pyrol. temp.: 550° C.
   $SiH_4$ Pressure: 0.45 Torr
   $AsH_3$ cycle 1 time: 10 min (formation of layer 33B)
   $SiH_4$ cycle 2 time: 25 min (" " 34A)
   $AsH_3$ cycle 2 time: 10 min (" " 34B)
   $SiH_4$ cycle 3 time: 153 min(" " 35)

The particularity of the structure shown in FIG. 7A is that there are two quantum conducting barrier layers. The first QCB layer 32A is formed directly onto monocrystalline region 20 at 650° C. (instead of 550° C.). The second QCB layer 32B is formed on layer 31' at 550° C. The thin amorphous silicon layer 31' thus separate the two QCB layers 32A and 32B by about 93 A. It is needed to conduct the second nitridization. In this example, the first As monolayer 33B is directly formed onto the 2sd QCB layer 32B and the second As monolayer is shifted from layer 32B by layer 34A thickness (could be shifted from 2sd QCB as well). The characteristic oxygen and nitrogen doses of this double SiON—Si—$Si_3N_4$ QCB structure are:

O level (barrier 32A): less than $3 \times 10^{15}$ atoms/$cm^2$ typically equal to $1.2 \times 10^{15}$ atoms/$cm^2$.

N level (barrier 32A): between 1 and $3 \times 10^{15}$ atoms/$cm^2$ typically equal to $1.6 \times 10^{15}$ atoms/$cm^2$.

N level (barrier 32B): between 0.5 and $3 \times 10^{15}$ atoms/$cm^2$ typically equal to $0.8 \times 10^{15}$ atoms/$cm^2$.

5. Formation of the electrical buried strap 37

After regions 24 and 25 formation, the electrical buried strap is fabricated. The As dose is 0.8 at/$cm^2$. As apparent in FIG. 7B, in the electrical buried strap 37, the frontiers with regions 19 and 20 are discontinued by N atoms segregation, so that QCB layer 32A is no longer efficient. The continuity is therefore ensured by the second QCB layer 32B. Advantageously, these two thin layers have the ability to prevent or slow diffusion of chemical species from one side of the layer to the other and to prevent or reduce transmission of forces associated with recrystallization from one side of the layer to the other. This type of structure could be a must for future memory product generations which will be more sensitive to recrystallization effects. However, it has a drawback which is the recovery time, i.e. the time lost to reduce the reactor temperature from 650 to 550° C. which is about 50 min and the contamination caused by this temperature change.

When a single wafer processing tool is used, most of the inconveniences recited above are eliminated. A SACVD Centura tool manufactured by APPLIED MATERIALS, Santa Clara, Calif., USA is adequate in all respects provided that some modifications are made to set the chamber with $SiH_4$, $NH_3$ and $AsH_3$ supply lines. Note that in this case, the notion of "stack 36" is not well adapted (because copyrolysis is used instead of sequential depositions), so that we will rather favor the term "layer 36" instead.

Single Si—$Si_3N_4$ QCB structure
1. Formation of the undoped amorphous silicon (Si) layer 31
   Insert temp.: room temperature
   Q-time: 3 hours
   $N_2$ load lock: Yes
   Susceptor temp.: 600° C.
   $SiH_4$ flow: 500 cc/min
   $SiH_4$ pressure: 160 Torr
   Deposition time: 10 s
2. Formation of the QCB layer 32
   Nitridization temp.: 650° C.
   Nitridization pressure: 500 Torr
   $NH_3$ flow: 3 l/min Nitridization time: 15 s
   Gas evacuation: 1 min
3. Formation of the electrical buried strap layer 36'
   $SiH_4$ & $AsH_3$ copyrol. temp.: 600° C.
   $SiH_4$ & $AsH_3$ copyrol. press.: 160 Torr
   $SiH_4$ flow: 500 cc/min $AsH_3$ flow (0.02% in $H_2$): 200 cc/min
   Deposition time: 300 s
   Deposition rate: 600 Å/min The resulting structure is shown in FIG. 8.

After regions 24 and 25 formation, the electrical buried strap is the same as buried strap 37 depicted in FIG. 6A.

The main particularity of the SACVD Centura process is the copyrolysis of $AsH_3$ and $SiH_4$ instead of depositing a succession of dual amorphous silicon layer/As monolayer to form stack 36 (if several dual layers are deposited). This could be a disadvantage because the dopants are spread in the buried strap layer 36' preventing them from having the barrier influence performed by the As monolayer to reduce strap recrystallization (see FIGS. 6A and 7A). The characteristic of this Si—$Si_3N_4$ QCB structure after SIMS measurements is a N level of about $3 \times 10^{15}$ atoms/$cm^2$.

Double SiON—Si—$Si_3N_4$ QCB structure

Figure 9:
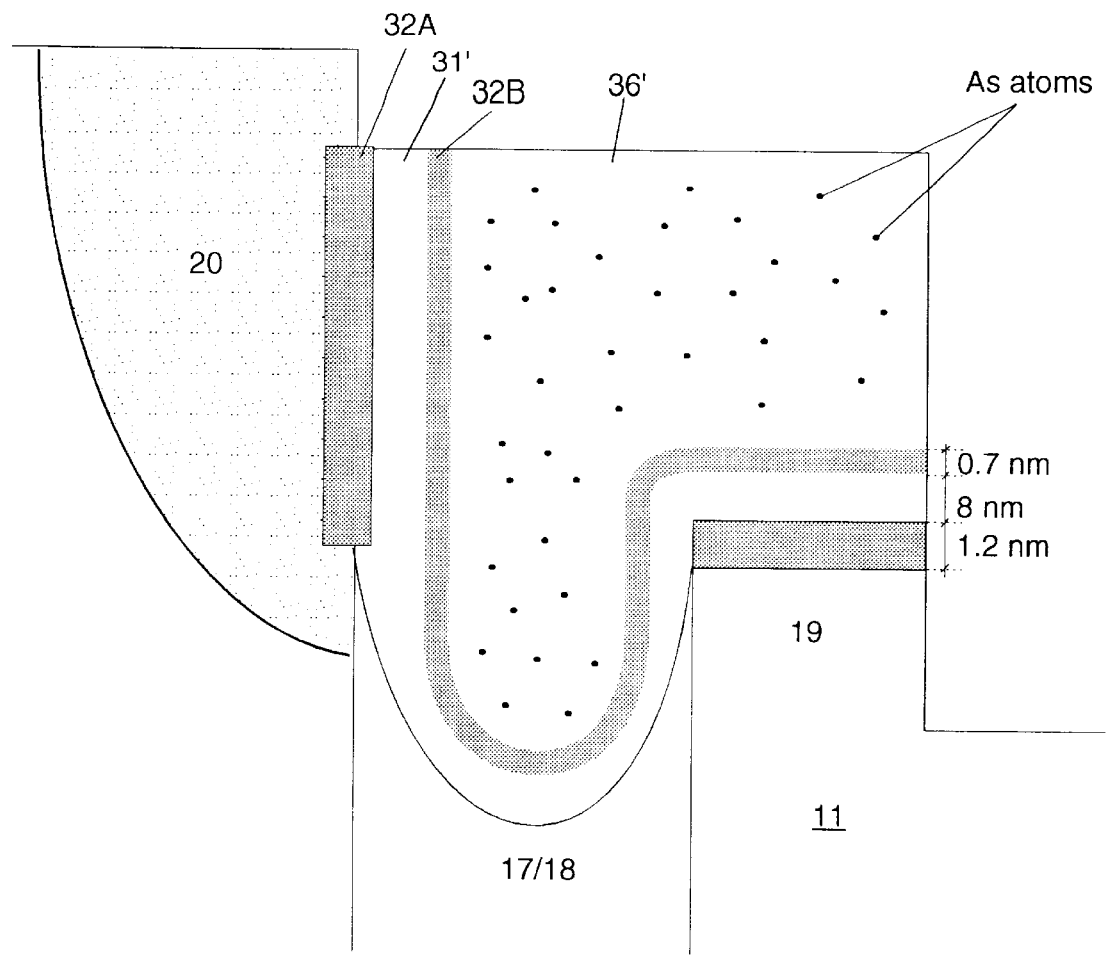
FIG. 9 shows the double SiON—Si—Si$_3$N$_4$ QCB structure fabricated to another further preferred embodiment of the methods of the present invention still based on the SACVD process.

A similar multilayered structure as the one described above in conjunction with FIGS. 7A and 7B can be obtained with the Centura tool. Oxynitride and $Si_3N_4$ are still the materials used to form the first and second QCB layers separated by a thin layer of undoped amorphous silicon. Now referring to FIG. 9, the double SiON—Si—$Si_3N_4$ QCB structure is formed according to the following processing step sequence.

1. Formation of the 1st oxynitride (SiON) layer 32A
   Insert temp.: room temperature
   Q-time: 3 hours
   $N_2$ load lock: Yes
   Nitridization temp.: 650° C.
   Nitridization pressure: 500 Torr
   $NH_3$ flow:
   3 l/min Nitridization time: 15 s
   Gas evacuation: 1 mn
2. Formation of the 100 undoped amorphous polysilicon (Si) layer 31'
   Susceptor temp.: 600° C.
   $SiH_4$ Pressure: 160 Torr
   $SiH_4$ flow: 500 cc/min Deposition time: 10 s
3. Formation of the 2nd $Si_3N_4$ QCB layer 32B
   Nitridization temp.: 600° C.

Nitridization pressure: 500 Torr
$NH_3$ flow: 3/1 min
Nitridization time: 15 s
Gas evacuation: 1 min 4. Formation of the electrical buried strap layer 36'
   $SiH_4$ & $AsH_3$ copyrol. temp.: 600° C.
   $SiH_4$ & $AsH_3$ copyrol. press.: 160 Torr
   $SiH_4$ flow: 500 cc/min $AsH_3$ flow (0.02% in $H_2$): 200 cc/min
   Deposition time :300 s
   Deposition rate: 600 Å/min As apparent in FIG. 9, the dopants are uniformly spread in buried strap layer 36'. SIMS measurements show no difference with results of the structure obtained by LPCVD described by reference to FIG. 7A. The drawbacks mentioned above with regards to the LPCVD process relating to the time necessary to change the temperature do not exist any longer, the ramp-up, ramp-down and deposition times are now very short. Obviously, such MQCB structures are well adapted to single wafer processing which is the future of the semiconductor industry. The reliability of reduced scale devices in deep trench cell capacitors is significantly increased by the use of quantum conducting barrier structures. QCB layers are thin enough to ensure a continuous conductive path between contiguous regions by a quantum mechanical effect and also act as a recrystallisation and diffusion barrier. The type of QCB structures of either type (single, double, . . . ) can vary to meet various device specifications and satisfy chip performance requirements. Their formation is driven by the different processing tools used and the working conditions thereof. Nitride based materials such as silicon oxynitride, silicon nitride and the like are adequate to prevent recrystallisation while maintaining the desired conduction characteristics. However, other materials could be envisioned, for instance, silicides formed still by in-situ CVD using chlorine or fluorine compounds. Conventional single thermal $SiO_2$—Si QCB structures are no more suitable for 0.2 μm DRAM chip because lack of electrical continuity and poor process robustness. The serial resistance of contiguous materials can be maintained very low only if the buried strap and its quantum conducting barrier are formed with an in-situ CVD deposition technique which does not create defects in said materials and allows to have very high dopant concentration and the desired electrical continuity. A high concentration level cannot been reached by ion implantation without creating crystalline defects. This global in-situ process offers the total control of what the IC manufacturer needs: reliability, low cost and customer satisfaction.

In essence, the purpose of this invention is thus the in-situ formation of the buried strap and its quantum conducting barrier wherein the buried strap is formed by in-situ doped polysilicon deposition. Only in-situ polysilicon doping permits to keep high IGFET and storage capacitor device performance at high level. Deep trench cell capacitors are extensively employed in EDO (extended data out), SDRAM (synchronous dynamic random access memory) and EDRAM (embedded DRAM) memory chips.

While the invention has been particularly described with respect to preferred embodiments thereof it should be understood by one skilled in the art that the foregoing and other changes in form and details may be made therein without departing from the spirit and scope of the invention.

What is claimed is:

1. A method of forming a strap (BS) and its quantum conducting barrier (QCB) to make an electrical connection between two semiconductor regions having a different crystalline nature separated by a region of an insulating material comprising the steps of:
   forming a thin continuous layer of undoped amorphous silicon to coat said regions;
   forming a QCB layer onto the structure;
   forming at least one dual layer comprised of an undoped amorphous silicon layer and a dopant monolayer onto the QCB layer to terminate the strap and its QCB; and,
   heating the structure to activate the dopants in the strap to allow an electrical continuity between said semiconductor regions through the QCB by a quantum mechanical effect, wherein all these steps are performed in situ in the same CVD tool.

2. The method of claim 1 wherein a material forming said QCB layer is selected in the group comprising silicon oxynitride, and silicon nitride.

3. The method of claim 2 wherein the material forming said QCB layer is silicon nitride.

4. The method of claim 3, wherein the silicon nitride is formed by a superficial nitridization of the continuous undoped amorphous silicon layer.

5. The method of claim 4 wherein a thickness of the silicon nitride QCB layer is less than 20 Å and a nitrogen level is in the $2-4\times10^{15}$ atoms/cm$^2$ range.

6. The method of claim 1 wherein the CVD tool is of the LPCVD and a pressure is less than 10 Torr.

7. The method of claim 1 wherein the CVD tool is of the LPCVD and pressures for the steps of forming the continuous undoped amorphous silicon and QCB layers are less than 0.6 Torr and comprised between 2 and 10 Torr respectively.

8. The method of claim 1 wherein the CVD tool is of the SACVD and a pressure is greater than 30 Torr.

9. The method of claim 1 wherein the CVD tool is of the SACVD and pressures for the steps of forming the continuous undoped amorphous silicon and QCB layers are greater than 30 Torr and 100 Torr respectively.

10. The method of claim 1 wherein a thickness of the undoped amorphous layer is less than 200 Å.

11. The method of claim 1 wherein a thickness of the QCB layer is less than 20 Å.

12. The method of claim 1 wherein a thickness of the undoped amorphous layer in the composite layer is more than 100 Å.

13. The method of claim 1 wherein the dopant in the dopant monolayer is arsenic.

14. A method of forming a strap (BS) and its quantum conducting barrier (QCB) to make an electrical connection between two semiconductor polycrystalline and monocrystalline regions having a different crystalline nature separated by a region of an insulating material comprising the steps of:
   forming a first QCB layer coating said polycrystalline and monocrystalline regions;
   forming a thin continuous layer of undoped amorphous silicon to coat said regions;
   forming a second QCB layer onto the structure;
   forming at least one dual layer comprised of an undoped amorphous silicon layer and a dopant monolayer onto the QCB layer to terminate the strap and its QCB; and,
   heating the structure to activate the dopants in the strap to allow an electrical continuity between said semiconductor regions through the QCB by a quantum mechanical effect, wherein all these steps are performed in situ in the same CVD tool.

15. The method of claim 14 wherein a material forming said first and second QCB layers is selected in the group comprising silicon oxynitride, and silicon nitride.

16. The method of claim 15 wherein the material forming said first and second QCB layers is silicon oxynitride and silicon nitride respectively.

17. The method of claim 16 wherein oxygen and nitrogen levels are less than $3\times10^{15}$ atoms/cm$^2$ and in the $2$–$4\times10^{15}$ atoms/cm$^2$ range respectively.

18. The method of claim 17 wherein a thickness of the QCB layer is less than 20 Å and the nitrogen level is in the $2$–$4\times10^{15}$ atoms/cm$^2$ range.

19. The method of claim 16 wherein the silicon nitride of said second QCB layer is formed by a superficial nitridization of the continuous undoped amorphous silicon layer.

20. The method of claim 14 wherein the CVD tool is of the LPCVD and a pressure is less than 10 Torr.

21. The method of claim 14 wherein the CVD tool is of the LPCVD and pressures for the steps of forming the continuous undoped amorphous silicon and QCB layers are less than 0.6 Torr and comprised between 2 and 10 Torr respectively.

22. The method of claim 14 wherein the CVD tool is of the SACVD and a pressure is greater than 30 Torr.

23. The method of claim 14 wherein the CVD tool is of the SACVD and pressures for the steps of forming the continuous undoped amorphous silicon and QCB layers are greater than 30 Torr and 100 Torr respectively.

24. The method of claim 14 wherein a thickness of the undoped amorphous layer is less than 200 Å.

25. The method of claim 14 wherein a thickness of the first and second QCB layers is less than 20 Å.

26. The method of claim 14 wherein a thickness of the undoped amorphous layer in the composite layer is more than 100 Å.

27. The method of claim 14 wherein the dopant in the dopant monolayer is arsenic.

28. A method of forming a buried strap (BS) and its quantum conducting barrier (QCB) in a structure wherein a doped polycrystalline silicon region is exposed at the bottom of a recess and separated from a monocrystalline region in a silicon substrate by a region of an insulating material comprising the steps of: forming a thin continuous layer of undoped amorphous silicon to coat said regions;

forming a QCB layer onto the structure;

forming at least one dual layer comprised of an undoped amorphous silicon layer and a dopant monolayer onto the QCB layer;

filling the recess with undoped amorphous silicon to terminate the buried strap and its QCB; and, heating the structure to activate the dopants in the buried strap to allow an electrical continuity between said polycrystalline and monocrystalline regions through the QCB by a quantum mechanical effect, wherein all these steps are performed in situ in the same CVD tool.

29. The method of claim 28 wherein a material forming said QCB layer is selected in the group comprising silicon oxynitride, and silicon nitride.

30. The method of claim 29 wherein the material forming the QCB layer is silicon nitride.

31. The method of claim 30 wherein the silicon nitride is formed by a superficial nitridization of the continuous undoped amorphous silicon layer.

32. The method of claim 31 wherein a thickness of the silicon nitride QCB layer is less than 20 Å and a nitrogen level is in the $2$–$4\times10^{15}$ atoms/cm$^2$ range.

33. The method of claim 28 wherein the CVD tool is of the LPCVD and a pressure is less than 10 Torr.

34. The method of claim 28 wherein the CVD tool is of the LPCVD and pressures for the steps of forming the continuous undoped amorphous silicon and QCB layers are less than 0.6 Torr and comprised between 2 and 10 Torr respectively.

35. The method of claim 28 wherein the CVD tool is of the SACVD and a pressure is greater than 30 Torr.

36. The method of claim 28 wherein the CVD tool is of the SACVD and pressures for the steps of forming the continuous undoped amorphous silicon and QCB layers are greater than 30 Torr and 300 Torr respectively.

37. The method of claim 28 wherein a thickness of the undoped amorphous layer is less than 200 Å.

38. The method of claim 28 wherein a thickness of the QCB layer is less than 20 Å.

39. The method of claim 28 wherein a thickness of the undoped amorphous layer in the composite layer is more than 100 Å.

40. The method of claim 28 wherein the dopant in the dopant monolayer is arsenic.

41. A method of forming a buried strap (BS) and its quantum conducting barrier (QCB) in a structure wherein a doped polycrystalline silicon region is exposed at the bottom of a recess and separated from a monocrystalline region in a silicon substrate by a region of an insulating material comprising the steps of:

forming a first QCB layer coating said polycrystalline and monocrystalline regions;

forming a thin layer of undoped amorphous silicon onto the structure;

forming a second QCB layer onto said undoped amorphous silicon layer;

forming at least one dual layer comprised of an undoped amorphous silicon layer and a dopant monolayer onto the second QCB layer;

filling the recess with undoped amorphous silicon to terminate the buried strap and its QCBs; and, heating the structure to activate the dopants in the buried strap to allow an electrical continuity between said polycrystalline and monocrystalline regions through the QCBs by a quantum mechanical effect, wherein all these steps are performed in situ in the same CVD tool.

42. The method of claim 41 wherein a material forming said first and second QCB layers is selected in the group comprising silicon oxynitride, and silicon nitride.

43. The method of claim 42 wherein the material forming said first and second QCB layers is silicon oxynitride and silicon nitride respectively.

44. The method of claim 43 wherein oxygen and nitrogen levels are less than $3\times10^{15}$ atoms/cm$^2$ and in the $2$–$4\times10^{15}$ atoms/cm$^2$ range respectively.

45. The method of claim 44 wherein a thickness of the QCB layer is less than 20 Å and the nitrogen level is in the $2$–$4\times10^{15}$ atoms/cm$^2$ range.

46. The method of claim 43 wherein the silicon nitride of the second QCB layer is formed by a superficial nitridization of the continuous undoped amorphous silicon layer.

47. The method of claim 41 wherein the CVD tool is of the LPCVD and a pressure is less than 10 Torr.

48. The method of claim 41 wherein the CVD tool is of the LPCVD and pressures for the steps of forming the continuous undoped amorphous silicon and QCB layers are less than 0.6 Torr and comprised between 2 and 10 Torr respectively.

49. The method of claim 41 wherein the CVD tool is of the SACVD and a pressure is greater than 30 Torr.

50. The method of claim 41 wherein the CVD tool is of the SACVD and pressures for the steps of forming the continuous undoped amorphous silicon and QCB layers are greater than 30 Torr and 300 Torr respectively.

51. The method of claim 41 wherein a thickness of the undoped amorphous layer is less than 200 Å.

52. The method of claim 41 wherein a thickness of the first and second QCB layers is less than 20 Å.

53. The method of claim 41 wherein a thickness of the undoped amorphous layer in the composite layer is more than 100 Å.

54. The method of claim 41 wherein the dopant in the dopant monolayer is arsenic.

\* \* \* \* \*